United States Patent [19]

Hayashi et al.

[11] Patent Number: 4,694,116
[45] Date of Patent: Sep. 15, 1987

[54] THIN-FILM SOLAR CELL

[75] Inventors: Yutaka Hayashi, Ibaraki; Toshio Mishuku, Gunma; Mitsuyuki Yamanaka, Ibaraki; Hideyo Iida, Takasaki, all of Japan

[73] Assignees: Agency of Industrial Science & Technology, Ministry of International Trade & Industry; Taiyo Yuden Co., Ltd., both of Tokyo, Japan

[21] Appl. No.: 842,210

[22] Filed: Mar. 21, 1986

[30] Foreign Application Priority Data

Mar. 22, 1985 [JP] Japan .................................. 60-56165

[51] Int. Cl.⁴ ............................................. H01L 31/06
[52] U.S. Cl. ..................................... 136/256; 136/258; 136/259; 357/30; 357/59; 357/67
[58] Field of Search ......... 136/256, 258 AM, 258 PC, 136/259; 357/30, 59 C, 67

[56] References Cited

U.S. PATENT DOCUMENTS 4,564,533 1/1986 Yamazaki .............................. 427/39

FOREIGN PATENT DOCUMENTS

59-161881 9/1984 Japan .......................... 136/258 AM

Primary Examiner—Aaron Weisstuch
Attorney, Agent, or Firm—Oblon, Fisher, Spivak, McClelland & Maier

[57] ABSTRACT

A thin-film solar cell has a two-layered transparent electrode formed on a transparent substrate, a photoelectric conversion section formed on the transparent electrode, and a back electrode formed on the photoelectric conversion section. The first layer of the transparent electrode is formed on the transparent substrate and is constituted of crystal grains having a large average diameter, while the second layer thereof is formed on the first layer and is constituted of crystal grains having a small average grain diameter. The sharp pointed tips of the coarse crystal grains of the first layer are covered by the fine crystal grains of the second layer so that the side of the transparent electrode in contact with the photoelectric conversion section presents a relatively smooth surface with rounded irregularities. Each layer is separately deposited on the respective transparent substrate.

15 Claims, 14 Drawing Figures

THIN-FILM SOLAR CELL

FIELD OF THE INVENTION AND RELATED ART STATEMENT

This invention relates to a thin-film solar cell having a transparent electrode, and more particularly to a thin-film solar cell wherein the energy conversion efficiency is improved through utilization of light refraction and scattering effects in the transparent electrode.

Among the various types of thin-film solar cells, one of the most promising types for future utilization is the amorphous semiconductor solar cell using an amorphous semiconductor material for its photoelectric conversion section. This is because such cells are intrinsically much cheaper to manufacture than the single crystal and other types, although there remains the problem of attaining the required conversion efficiency and other electrical properties.

Thus, many attempts have been made to increase the conversion efficiency of such cells and the diverse range of the research that has been conducted to this end is indeed very impressive. One approach has been to try to attain improvements in electrical properties through innovations in physical and mechanical structure.

Typical of these is the solar cell disclosed in Japanese Laid Open patent application No. 58(1983)-57756, wherein the solar cell has a transparent substrate made of glass or the like and a transparent electrode provided on the transparent substrate is deliberately given a rough surface by making its crystal grains large.

Figure 1:
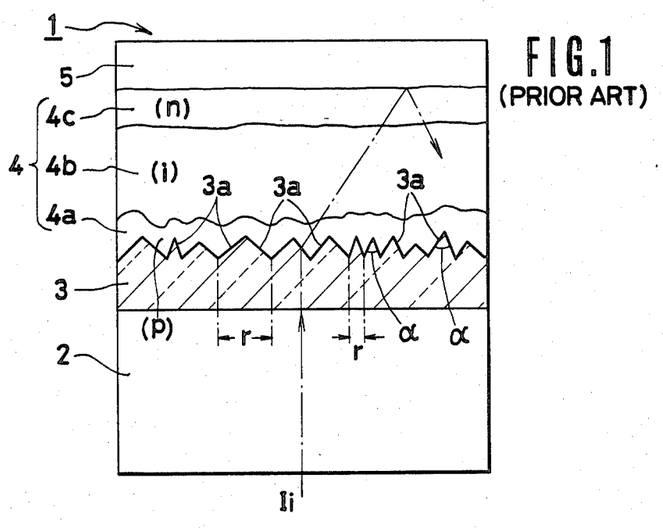
FIG. 1 is a schematic view showing the basic structure of a conventional thin-film solar cell wherein the transparent electrode has a rough surface.

The basic structure of the conventional solar cells fabricated in line with this invention, including those disclosed in the aforesaid Laid Open Application, is generally depicted in FIG. 1. As will be noted, the overall structure of the solar cell 1 shown in the figure is fairly commonplace and includes most of the features that are ordinarily a part of an amorphous semiconductor solar cell of this type. More specifically, the solar cell 1 consists of a transparent substrate 2 of glass or the like, a transparent electrode 3 constituted of a film of tin oxide or the like formed on the transparent substrate 2, a photoelectric conversion section 4 formed on the transparent electrode 3 by successively laminating thereon a p-layer 4a, an i-layer (low impurity concentration) 4b, and an n-layer 4c, each of these layers being basically constituted of an appropriate amorphous semiconductor such as a-Si (amorphous silicon), and a back electrode 5 of an appropriate light-reflecting material such as aluminum, silver, or the like formed on the uppermost layer of the photoelectric conversion section 4.

What characterizes the solar cell of this ordinary structure is the physical makeup or surface structure of the transparent electrode 3. Namely, when the transparent electrode 3 is formed on the transparent substrate 2, the fabrication conditions are so selected as to constitute it as a composite body made up of relatively large crystal grains 3a, in this way providing the transparent electrode 3 with an irregular, rough surface.

In an amorphous semiconductor solar cell having a rough-surfaced transparent electrode of this type, a fairly large percentage of the incident light Ii entering from the side of the transparent substrate 2 is refracted or scattered by the relatively large crystal grains 3a at the boundary between the transparent electrode 3 and the p-layer 4a. As a result, in passing through the photoelectric conversion section 4 the incident light Ii travels along a longer path than in the case of earlier type cells which, not having the rough surface, allow the incident light to pass straight through the photoelectric conversion section without being subjected to any significant refraction or scattering. Consequently, development of the illustrated solar cell enabled a considerable improvement in photoelectric conversion efficiency $\eta$ over that of the amorphous semiconductor solar cells that had been available up to that time.

In general, the size of the crystal grains 3a mentioned above is represented in terms of the average grain diameter Ra obtained by averaging the base diameter r of the individual crystal grains. The height of the grains 3a, while varying considerably depending on the average grain diameter Ra, is usually about one-third the thickness of the transparent electrode 3.

From the foregoing, it will be appreciated that in the conventional amorphous semiconductor solar cell the idea of constituting the transparent electrode of relatively large crystal grains so as to provide it with a rough surface has made an effective and significant contribution toward improvement of the conversion efficiency $\eta$.

However, a close study of the other electrical properties of solar cells shows that there is still much room for improvement. More specifically, it is well known that although the conversion efficiency $\eta$ represents a comprehensive property of this type of solar cell there are three separate electrical properties that have to be taken into consideration: the short-circuit current density Jsc, the open-circuit voltage Voc, and the fill factor FF.

Namely, the conversion efficiency $\eta$ is proportional to these three factors:

$$\eta \propto \text{Jsc} \cdot \text{Voc} \cdot \text{FF} \tag{1}$$

Figure 2:
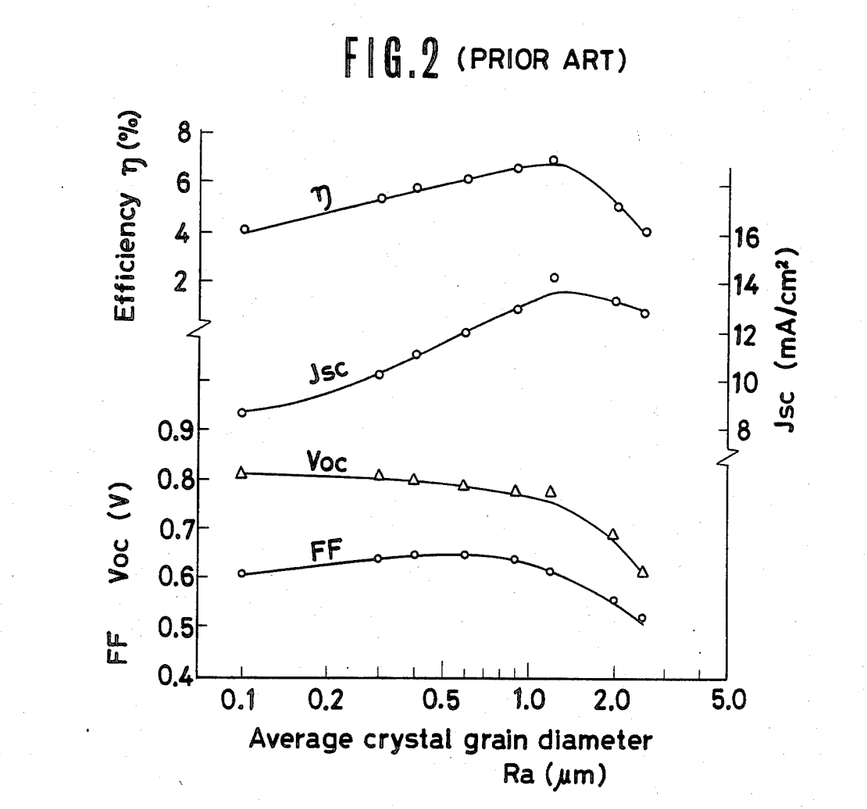
FIG. 2 is a graph showing characteristic curves for a typical sample of a conventional thin-film solar cell.

For examining these three properties in a conventional amorphous semiconductor solar cell of the basic structure shown in FIG. 1, these and the other electrical properties of a number of samples of such solar cells were measured and plotted, whereby there was obtained a representation of the properties of a typical type of sample as shown in FIG. 2.

First, using the sample properties shown in FIG. 2 for examining the relationship between the average grain diameter Ra of the crystal grains 3a making up the rough surface of the transparent electrode and the conversion efficiency $\eta$, it will be noted that within the average grain diameter range of 0.1 $\mu$m to about 1.0 $\mu$m or 1.2 $\mu$m, the conversion efficiency $\eta$ improves with increasing average grain diameter Ra.

Looking at the other curves in FIG. 2, it will be easily seen that the increase in the conversion efficiency within this range is due almost entirely to the improvement in the short-circuit current density Jsc. More specifically, an examination of the changes in the curves representing the short-circuit current density Jsc, the open-circuit voltage Voc, and the fill factor FF within the aforesaid grain diameter range shows that the short-circuit current density rises sharply with increasing average grain diameter Ra, while the fill factor rises only slowly up to an average grain diameter Ra of about 0.6 $\mu$m and then falls off and the open-current voltage Voc exhibits a downward trend from the very beginning.

Obviously this is not a desirable state of affairs since, from equation (1) above, it is easy to see that the optimum improvement in efficiency will be attained when all three factors, the short-circuit current density Jsc, the open-circuit voltage Voc, and the fill factor FF all improve together.

In fact it is clear from FIG. 2 that in the aforesaid sample what improvement there is obtained in the conversion efficiency $\eta$ is realized only because in the range of average grain diameter Ra between 0.1 $\mu$m and 1.0 $\mu$m to 1.2 $\mu$m the rate of increase in the short-circuit current density Jsc with increasing Ra is somewhat greater than the rate of decrease in the open-circuit voltage Voc. Here, assuming for the sake of discussion that like the short-circuit current density curve, the curve for the open-circuit voltage Voc should also ascend (or at least not, descend) with increasing average grain diameter Ra within the aforesaid grain diameter range, then obviously it would be possible to realize a greater improvement in the conversion efficiency $\eta$. At any rate, it is clear from FIG. 2 that the characteristic curve for the open-circuit voltage Voc puts a drag on any attempt to improve the conversion efficiency $\eta$.

It is thus seen that when the average grain diameter Ra of the crystals constituting the transparent electrode becomes larger within a certain prescribed range, there is in fact obtained an improvement in the short-circuit current density Jsc which in turns lead to some degree of improvement in the conversion efficiency $\eta$ but there is obtained only little improvement in the fill factor FF, while the open-circuit voltage Voc actually decreases. Moreover, this tendency is by no means peculiar to the particular type of solar cell sample whose characteristics are plotted in FIG. 2 but applies generally to all types of thin film solar cells even when produced using different conditions. In fact, in a fair percentage of such cells both the open-circuit voltage Voc and the fill factor FF exhibit declining tendencies from the very beginning.

In view of these circumstances, the inventors first carried out research to determine the cause for the decrease that occurs in the open-circuit voltage Voc and, in some cases, even in the fill factor FF. In the first stage of the work they carefully examined the structure of the rough surface of the transparent electrode 3 and their observations learned that, as shown in the cross-section of the conventional solar cell shown in FIG. 1, all of the crystal grains 3a for scattering the incident light Ii have sharply pointed tips. More specifically, although the apex angles $\alpha$ between the side surfaces at the tips of the respective crystal grains 3a are in some cases acute and in others obtuse, the tips all exhibit sharp, angular points with no rounding whatsoever.

This observation led the inventors to make further studies, the results of which strongly implied that the shape of the tips of the crystal grains 3a tends to hinder increase, and may even cause decrease, of the open-circuit voltage Voc and the fill factor FF.

The reason for this will be easily understood from a physical and geometric analysis with respect to FIG. 1. When the crystal grains have sharp tips, the thickness of the p-layer 4a formed thereon is not uniform in the horizontal direction, giving rise to local variations in thickness, and this may have an adverse effect on the homogeneity of the p-i junction and the i-n junction formed later.

In actuality, the thickness of the p-layer 4a was in the worst cases so exceedingly thin that it could only be concluded that a substantially short circuited condition existed between the i-layer 4b formed on the p-layer 4a and the transparent electrode 3.

Though the investigation was carried out primarily with respect to amorphous semiconductor type solar cells, it is obvious from the foregoing findings that the problems touched on here could naturally just as well occur in single crystal or polycrystal type solar cells.

Attempts have also been made in conjunction with crystalline type solar cells to improve the conversion efficiency by deliberately providing the photoelectric conversion side of the substrate crystal with a rough surface. In this case the mechanism contributing to the improvement in conversion efficiency is no different from that in an amorphous type solar cell, i.e. the improvement derives from the structure of the rough surface itself.

OBJECTS AND SUMMARY OF THE INVENTION

In view of the aforesaid drawbacks of conventional amorphous and crystalline type thin-film solar cells having a transparent electrode constituted to have a rough surface, it is an object of the present invention to provide a solar cell of such type with an improved conversion efficiency. It is a specific object of the invention to eliminate the problems caused by sharp crystal grain tips in the surface structure of the transparent electrode of such a solar cell, thereby improving the short-circuit current density and such other electrical properties of the solar cell as its open-circuit voltage and the fill factor.

According to the present invention there is provided a thin-film solar cell comprising a transparent substrate, a transparent electrode, a photoelectric conversion section, and a back electrode provided one on the other in the order mentioned, wherein the transparent electrode is constituted of a first layer which is in contact with the transparent substrate and a second layer formed on the first layer which is in contact with the photoelectric conversion section and forms an interface between itself and the conversion section, the first layer and the second layer being constituted of crystal grains, the average grain diameter of the crystal grains of the second layer being smaller than the average grain diameter of the crystal grains of the first layer, each layer being separately deposited on the respective transparent substrate.

When the transparent electrode is constituted in this manner, although the first layer formed of crystal grains with a relatively large average grain diameter and having sharp points presents a rough surface, the sharp tips at the surface of the upper surface of the first layer are effectively rounded by the provision thereon of the second layer formed of crystal grains with a relatively small average grain diameter.

As a result, the flatness of the layers of the photoelectric conversion section formed on the transparent electrode can be made gradually greater in the order of the p-layer, the i-layer, and the n-layer, without any reduction in the light scattering effect on the incident light Ii. Local variation in thickness of the layers of the photoelectric conversion section can thus be prevented and a good structure at the junctions between these layers can be secured. As a consequence, there is obtained not only an improvement in the short-circuit current density presumably caused by the light scattering effect, but also an improvement in the open-circuit voltage and the fill factor caused by the elimination of the sharp, pointed crystal grain tips which in addition to scattering light have also given rise to the aforesaid drawbacks. It therefore becomes possible to fabricate a thin film semiconductor solar cell exhibiting a large overall conversion efficiency.

The other objects and features of the invention will now be explained in detail with reference to the drawings.

BRIEF DESCRIPTION OF THE DRAWINGS

FIGS. 9(A), (B) and (C) are scanning electron micrographs of the second transparent electrode layer, the first transparent electrode layer, and the second and first transparent electrode layers as overlaid one on the other, in the case where these are formed by the CVD method.

DETAILED DESCRIPTION OF THE PREFERRED EMBODIMENTS

Figure 3:
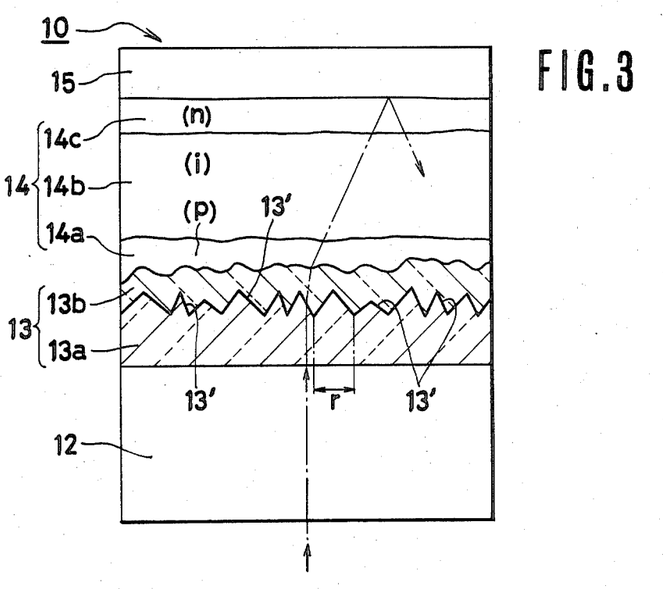
FIG. 3 is a schematic cross-sectional view of one embodiment of a thin-film solar cell according to this invention.

FIG. 3 shows the basic structure of an amorphous semiconductor solar cell improved by the incorporation of the present invention.

As shown in the drawing, the solar cell 10 has a transparent substrate 12 made of an appropriate material such as glass on which, in accordance with the contemplation of this invention, there is provided a first layer 13a constituting one part of a transparent electrode 13 and being made up of crystal grains 13' of a relatively large average grain diameter Ra so that this first layer 13a exhibits a large scattering effect with respect to incident light Ii.

The tips of the crystal grains 13' constituting the first layer 13a are sharply pointed, and, importantly, do not detract from the effect of the invention even though they have sharp points.

On the first layer 13a is formed a second layer 13b made up of relatively fine crystal grains, i.e. having a relatively small average grain diameter, which are capable of providing substantially the same effect as would be obtained by rounding the tips of the crystal grains of the first layer.

This arrangement provides the transparent electrode 13 with a smoother surface than it would have without the second layer 13b.

The so-formed transparent electrode 13 is then overlaid with a photoelectric conversion section 14 using whatever conventional fabrication method and conditions are determined to provide a photoelectric conversion section of optimum quality. Finally there is overlaid on the photoelectric conversion section 14 a reflective back electrode 15 which may be formed of an appropriate metal such as silver or be formed in a two-layered structure comprised of a transparent thin-film layer and a metallic thin-film layer.

The photoelectric conversion layer 14 is generally constituted as a pin junction by forming upward from the interface formed between itself and the second layer 13b of the transparent electrode 13 a p-layer 14a constituted of a semiconductor exhibiting p-type conductivity, an i-layer 14b constituted of an intrinsic semiconductor, and an n-layer 14c constituted of a semiconductor exhibiting n-type conductivity.

The invention will now be described with reference to concrete examples of solar cells fabricated in accordance with the aforesaid basic structure.

EXAMPLE 1

A 30 mm by 30 mm square of glass (#7059 glass produced by Corning Glass Works of the U.S.A.) was used as the transparent substrate 12. The glass was thoroughly washed and then heated on a hot plate adjusted to 480° C.

The starting material for the transparent electrode 13 was prepared by dissolving 25 g of $SnCl_4 \cdot 5H_2O$ and 0.317 g of $SbCl_3$ in 150 ml of a 1% aqueous solution of HCl. The resulting solution was sprayed on the heated glass substrate in the atmosphere, whereby the first layer 13a was formed as a 0.73 μm-thick film of $SnO_2$.

Figure 4:
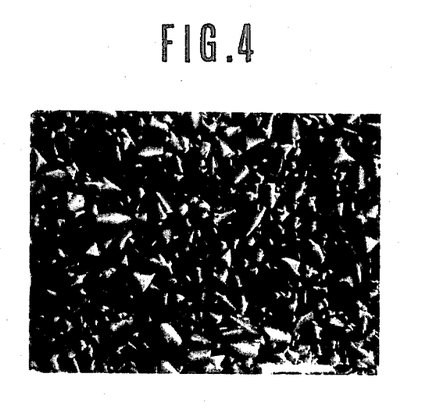
FIG. 4 is a scanning electron micrograph showing the grain structure of the surface of the first transparent electrode layer in an embodiment according to this invention.

A scanning electron micrograph of the surface of the so-formed first layer 13a is shown in FIG. 4. As will be noted, the crystal grains are coarse and have a large crystal grain diameter, and moreover their tips form sharp points.

The transparent electrode 13 was then completed by spray-forming a second layer 13b on the first layer 13a using the same starting material. In this case, however, the spraying was conducted with the substrate and the $SnO_2$ film forming temperature at 380° C., considerably lower than the 480° C. temperature used in forming the first layer 13a.

The thickness of the second layer 13b was 0.44 μm, meaning that the overall thickness of the transparent electrode 13 was 1.17 μm.

Figure 5:
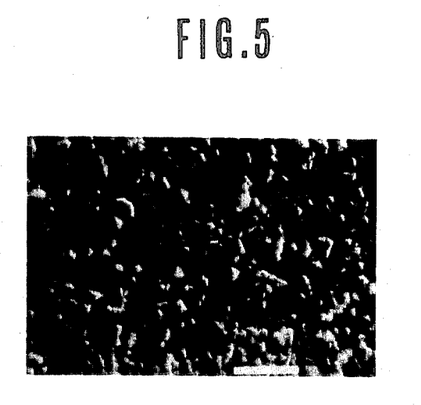
FIG. 5 is a scanning electron micrograph showing the grain structure of the surface of a second transparent electrode layer applied in accordance with this invention.

A scanning electron micrograph of the surface of the so-formed second layer 13b is shown in FIG. 5. Comparing this surface with that of the first layer 13a shown in FIG. 4, it will be seen that the second layer 13b is formed of much finer crystal grains which give the sharp points of the first layer 13a a rounded, bell-like appearance.

Thus in this embodiment, the average grain diameter of the crystal grains of the second layer 13b was made smaller than that of the first layer 13a by reducing the temperature at the time of forming the second layer 13b to below that used at the time of forming the first layer 13a. This point will be discussed in more detail later.

Following the formation of the transparent electrode 13 in accordance with the idea of this invention as described above, the layers of photoelectric conversion section 14 were successively formed on the transparent electrode 13 using the parallel-plate plasma CVD method.

For formation of the p-layer 14a, a mixed gas consisting of $SiH_4$ gas, 0.5% by volume based on the $SiH_4$ gas of $B_2H_6$ gas, and 50% by volume of hydrocarbon ($CH_4$) gas was introduced into the vacuum chamber of a plasma CVD apparatus and vacuum deposition was carried out under a degree of vacuum of 1.0 Torr with high frequency electric power (frequency—13.56 MHz, power density—0.1 W/cm$^2$) applied between the parallel-plate electrodes. The resulting p-layer 14a had a thickness of about 130 Å.

The mixed gas in the chamber was then replaced with $SiH_4$ gas and the i-layer 14b was formed to a thickness of about 5000 Å under a degree of vacuum of 1.5 Torr.

Next, the $SiH_4$ gas was replaced with a mixed gas consisting of $SiH_4$ gas and 0.8% by volume based on the $SiH_4$ gas of $PH_3$ gas, whereafter the n-layer 14c was formed to a thickness of about 300 Å under a degree of vacuum of 1.5 Torr.

During formation of the photoelectric conversion section 14 the temperature of the glass substrate 12 was held at 250° C.

Finally, the back electrode 15 was formed on the photoelectric conversion section 14 by vacuum depositing a film of aluminum thereon.

The amorphous semiconductor solar cell fabricated as Example 1 in the manner described above was exposed to incident light Ii at 100 mW/cm$^2$ using an AM-1 solar simulator. The solar cell exhibited the following characteristics:

| Conversion efficiency: | $\eta$ = 9.26% |
|---|---|
| Short-circuit currency density: | Jsc = 17 mA/cm$^2$ |
| Open-circuit voltage: | Voc = 0.82 V |
| fill factor: | FF = 0.664 |

When the transparent electrode of the solar cell according to Example 1 was subjected to X-ray diffraction, the first layer 13a exhibited a first peak for the (200) direction, with (101)/(200) being equal to 0.08, while after the formation of the second layer 13b, the first peak was for the (101) direction and (101)/(200) was 1.8.

In order to demonstrate that the solar cell according to Example 1 exhibits the effect of the application of this invention a Comparative Example 1, identical to Example 1 except that the transparent electrode consisted of only the first layer, was fabricated as described below.

COMPARATIVE EXAMPLE 1

A glass substrate was heated to 450° C., approximately the same temperature as in Example 1, and a 1.3 μm-thick film of $SnO_2$ was formed thereon using the same starting material as in Example 1. This film was used as the transparent electrode.

The solar cell was thereafter completed by forming the photoelectric conversion section and the back electrode using exactly the same methods and conditions as in Example 1.

When tested under the same condition as those used for Example 1, the solar cell exhibited the following characteristics:

| Conversion efficiency: | $\eta$ = 7.0% |
|---|---|
| Short-circuit current density: | Jsc = 16.9 mA/cm$^2$ |
| Open-circuit voltage: | Voc = 0.7 V |
| fill factor: | FF = 0.59 |

By X-ray diffraction it was found that: (101)/(200)=0.05. In the solar cell according to Comparative Example 1 the surface of the transparent electrode of the solar cell naturally exhibited sharply pointed crystal grain tips.

Comparing the characteristics (I) of the Example 1 in accordance with this invention with the characteristics (II) of the Comparative Example 1 according to the prior art method, it is noted that the invention manifests an unexpectedly large effect. Namely, the object of the invention to increase the conversion efficiency while, if not improving, at least preventing a decline in the open-circuit voltage Voc and fill factor FF, is fully accomplished. Moreover, all of the characteristics show higher values than those of an amorphous semiconductor solar cell fabricated according to the conventional method.

On the basis of these results, in order to confirm the versatility of the present invention, a number of sample solar cells were made using exactly the same basic fabrication processes, fabrication conditions, and starting materials etc as in the case of Example 1 but using various different substrate temperatures during the formation of the first and second layers 13a, 13b of the transparent electrode 13. The resulting solar cells were designated as Examples 2-6 and their charactertics were as shown below.

EXAMPLE 2

Substrate temperature during formation of first layer: 480° C.
Substrate temperature during formation of second layer: 350° C.
Conversion efficiency: $\eta$=9.2%

| Short-circuit current density: | Jsc = 17.1 mA/cm$^2$ |
|---|---|
| Open-circuit voltage: | Voc = 0.82 V |
| fill factor: | FF = 0.66 |

EXAMPLE 3

Substrate temperature during formation of first layer: 480° C.
Substrate temperature during formation of second layer: 360° C.

| Conversion efficiency: | $\eta$ = 9.2% |
|---|---|
| Short-circuit current density: | Jsc = 16.9 mA/cm$^2$ |
| Open-circuit voltage: | Voc = 0.83 V |
| fill factor: | FF = 0.66 |

EXAMPLE 4

Substrate temperature during formation of first layer: 460° C.

Substrate temperature during formation of second layer: 380° C.

| | |
|---|---|
| Conversion efficiency: | $\eta = 9.2\%$ |
| Short-circuit current density: | Jsc = 16.8 mA/cm$^2$ |
| Open-circuit voltage: | Voc = 0.84 V |
| fill factor: | FF = 0.65 |

EXAMPLE 5

Substrate temperature during formation of first layer: 420° C.
Substrate temperature during formation of second layer: 380° C.

| | |
|---|---|
| Conversion efficiency: | $\eta = 9.1\%$ |
| Short-circuit current density: | Jsc = 16.6 mA/cm$^2$ |
| Open-circuit voltage: | Voc = 0.85 V |
| fill factor: | FF = 0.65 |

EXAMPLE 6

Substrate temperature during formation of first layer: 420° C.
Substrate temperature during formation of second layer: 350° C.

| | |
|---|---|
| Conversion efficiency: | $\eta = 9.01\%$ |
| Short-circuit current density: | Jsc = 16.6 mA/cm$^2$ |
| Open-circuit voltage: | Voc = 0.84 V |
| fill factor: | FF = 0.65 |

In all of the examples, the conversion efficiency is over 9%, while the values for the open-current voltage Voc and the fill factor FF are at satisfactory levels approximately equal to those for Example 1. The effect of the invention is thus manifested to a high degree in all of the Examples, and there is no sign whatsoever of an improvement in conversion efficiency being attained at the sacrifice of the open-circuit voltage Voc or the fill factor FF.

Further, when the aforementioned Examples 1 to 6 were subjected to X-ray diffraction, in all cases the peak for the first layer was at the (200) direction, with (101)/(200)<0.5, and after the formation of the second layer (101)/(200)>0.5.

Further, the sheet resistance of the transparent electrode in all of the Examples was about 10-20 $\pi/\square$, whereas the transmittance for incident light of a wavelength of 0.5 $\mu$m was not less than 80%.

Another Example, Example 7, was fabricated using the CVD method for formation of the first and second transparent electrode layers 13a, 13b.

A bubbler containing SnCl$_4$, a bubbler containing SbCl$_3$, and a bubbler containing pure water were held at minus 25° C., minus 15° C., and minus 10° C., respectively, and argon was passed at 0.6 l/min as the carrier gas. The glass substrate was heated to 450° C. and exposed to carrier gas containing the aforesaid components so as to form an approximately 0.7 $\mu$m-thick SnO$_2$ film thereon as the first transparent electrode layer 13a.

Next, the substrate was lowered in temperature to 360° C. and then exposed to the same carrier gas so as to form an approximately 0.4 $\mu$m-thick SnO$_2$ film thereon as the second transparent electrode layer 13b.

Following the formation of the transparent electrode in this manner, the Example 7 was completed using exactly the same fabrication processes and conditions as used for Example 1, with the following results:

| | |
|---|---|
| Conversion efficiency: | $\eta = 9.06\%$ |
| Short-circuit current density: | Jsc = 16.8 mA/cm$^2$ |
| Open-circuit voltage: | Voc = 0.83 V |
| fill factor: | FF = 0.65 |

As can be seen from these results, the effect of the invention is also clearly manifested in Example 7 fabricated using the CVD method.

Needless to say, when the first and second transparent electrode layer 13a, 13b are produced using the CVD method, the roughness of the first layer and the pattern of the second layer correspond to FIGS. 4 and 5, respectively.

Examples 8-12 were further fabricated in order to determine the effect of varying the thicknesses of the first and second layers 13a, 13b constituting the transparent electrode. Aside from the differences in the thickness of the films, all of the Examples 8-12 were fabricated using the same conditions as those used for Example 1.

EXAMPLE 8

| | |
|---|---|
| Thickness of first layer: | 12000 Å |
| Thickness of second layer: | 4000 Å |
| Conversion efficiency: | $\eta = 9.1\%$ |
| Short-circuit current density: | Jsc = 17.0 mA/cm$^2$ |
| Open-circuit voltage: | Voc = 0.81 V |
| fill factor: | FF = 0.66 |

EXAMPLE 9

| | |
|---|---|
| Thickness of first layer: | 12000 Å |
| Thickness of second layer: | 8000 Å |
| Conversion efficiency: | $\eta = 9.0\%$ |
| Short-circuit current density: | Jsc = 16.5 mA/cm$^2$ |
| Open-circuit voltage: | Voc = 0.84 V |
| fill factor: | FF = 0.65 |

EXAMPLE 10

| | |
|---|---|
| Thickness of first layer: | 7000 Å |
| Thickness of second layer: | 4000 Å |
| Conversion efficiency: | $\eta = 9.3\%$ |
| Short-circuit current density: | Jsc = 17.1 mA/cm$^2$ |
| Open-circuit voltage: | Voc = 0.83 V |
| fill factor: | FF = 0.66 |

EXAMPLE 11

| | |
|---|---|
| Thickness of first layer: | 4000 Å |
| Thickness of second layer: | 1500 Å |
| Conversion efficiency: | $\eta = 9.0\%$ |
| Short-circuit current density: | Jsc = 16.7 mA/cm$^2$ |
| Open-circuit voltage: | Voc = 0.84 V |
| fill factor: | FF = 0.64 |

EXAMPLE 12

| | |
|---|---|
| Thickness of first layer: | 4000 Å |
| Thickness of second layer: | 2500 Å |
| Conversion efficiency: | $\eta = 9.1\%$ |
| Short-circuit current density: | $Jsc = 16.7$ mA/cm$^2$ |
| Open-circuit voltage: | $Voc = 0.85$ V |
| fill factor: | $FF = 0.64$ |

The results of X-ray diffraction carried out with respect to the aforesaid Examples 7–12 were like those for the Examples 1–6 mentioned earlier. Namely, the relationship $(101)/(200) < 0.5$ held for the first layer, whereas after formation of the second layer this became $(101)/(200) < 0.5$.

As is clear from the characteristics for the respective Examples 7–12 shown above, insofar as the basic condition of this invention that the average grain diameter Ra of the crystal grains of the first layer 13a should be larger than that of the crystal grains of the second layer 13b is met, variation of the overall thickness of the transparent electrode or of the individual layers thereof, even to a fairly large degree, has no particular adverse effect on the electrical characteristics of the resulting solar cell.

Still, as will be noted from the results for the Examples 1–7, the effect becomes more pronounced as the average grain diameter Ra of the second layer becomes smaller in comparison with that of the first layer.

Moreover, the foregoing Examples demonstrate that in using either the spray method or the CVD method it is possible to control the grain diameter of the layers by controlling the temperature of the substrate during layer formation. Simply stated, the lower the temperature, the smaller will be the grain diameter. This is further concretely indicated by the graph of FIG. 6 which shows the relationship between the growth temperature or the substrate temperature on the one hand and the average grain diameter on the other.

Figure 6:
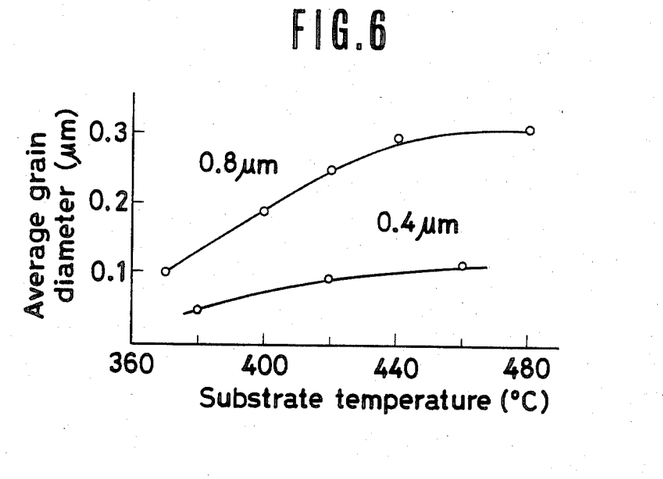
FIG. 6 is a graph showing a typical relationship between the film forming or substrate temperature and the average grain diameter of the formed crystals.

From FIG. 6 it will be noted that there is a correlation not only between the substrate temperature and the average grain diameter but also between the film thickness and the average grain diameter. More specifically, the substrate temperature-average grain diameter curve for a 0.8 μm-thick SnO$_2$ film is positioned upwardly in FIG. 6 from the corresponding curve for a 0.4 μm-thick film, meaning that for the same temperature the crystal grains will be coarser in a thicker film than in a thinner one.

From the foregoing it can therefore be concluded that since it is desirable to make the average grain diameter of the second layer 13b of the transparent electrode 13 sufficiently small, it is, in light of FIG. 6, advisable to form the second layer 13b at a relatively low substrate temperature. However, when this is actually tried, it is found that consideration must be given to another problem.

More specifically, it is so well known as not to require the citing of specific examples that in the formation of, say, an SnO$_2$ film, the rate of film formation will, in the range of temperatures between somewhat lower than 300° C. and somewhat higher than 500° C. used in conjunction with the foregoing Examples, decrease on the order of 90% per 100° C. decrease in temperature. Even by a simple calculation this means that reducing the film forming temperature by 100° C. will increase the time required for forming even a film of half thickness by five times. It is thus easy to imagine that if an attempt is made to form a second layer with an average grain diameter even smaller than that of the foregoing examples, the formation of the second layer could well come to require ten or so times the time required for formation of the first layer. This is by no means a desirable state of affairs since if the production of the solar cells cannot be carried out on a mass production basis the advantage gained by the use of inexpensive amorphous materials is lost.

From these considerations, it becomes practically most advantageous to make a tradeoff between the aforesaid incompatible factors within the reasonable ranges for the thickness and the average grain diameter of the second layer, and from this standpoint the Examples described in the foregoing represent a fairly reasonable compromise.

Figure 7A:
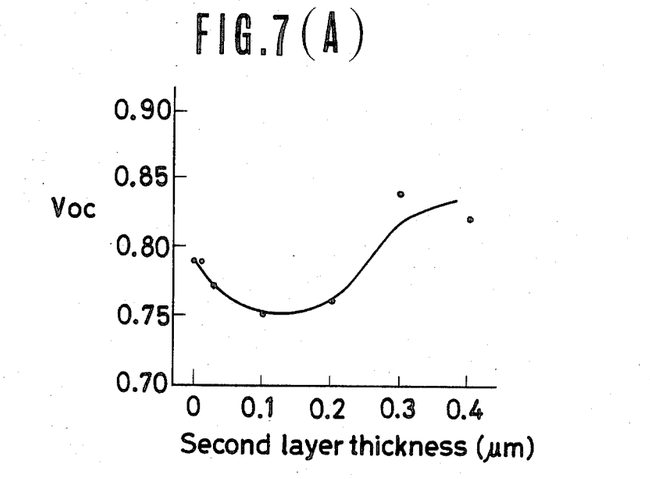
FIG. 7(A) is a graph showing a typical example of the relationship between the thickness of the second transparent electrode layer and the open-circuit voltage.
Figure 7B:
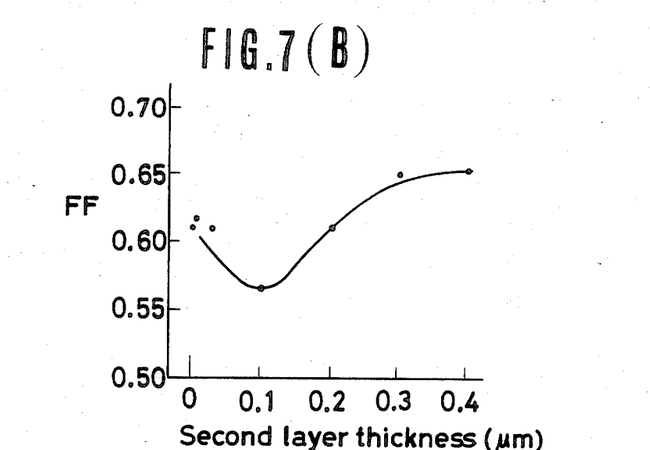
FIG. 7(B) is a graph showing a typical example of the relationship between the thickness of the second transparent electrode layer and the curve factor.

To carry this thinking a step further the Examples were analyzed to determine reasonable and typical value for the formation temperatures of the first and second layers and for the thickness of the first layer 13a. As a result, a temperature of 480° C. was selected as the formation temperature for the first layer, 380° C. as the formation temperature for the second layer and 7000 Å as the thickness of the first layer 13a, and using these values an investigation was carried out to determine the effect that varying the thickness of the second layer has on the open-circuit voltage Voc and the fill factor FF. The results are shown in the graphs of FIGS. 7(A) and (B).

These graphs show that for a first layer of given thickness there is, from the point of design, a range of advantageous thicknesses for the second layer. In the case in question this range extends from about 0.2 μm to about 0.4 μm, which substantially matches the conditions for the Examples 1 and 10 described above. Further, the magnitude of this thickness should be between that of the height of the irregularities on surface of the first layer and twice this magnitude.

The present invention, when viewed as an improvement of conventional art, thus encompasses a fairly wide range of selectable design parameters as regards the thicknesses of the first and second layers and the ratio between these thicknesses. Nevertheless, it will be appreciated that certain specific ranges are particularly preferable from the point of design.

To test this proposition, a number of Comparative Examples were fabricated using values for the thickness of the first layer, the thickness of the second layer and the ratio between these thickness that fell rather far outside the ranges used in conjunction with the foregoing Examples. These were designated as Comparative Examples 2–6 as shown below:

COMPARATIVE EXAMPLE 2

| | |
|---|---|
| Thickness of first layer: | 12000 Å |
| Thickness of second layer: | 3000 Å |
| Conversion efficiency: | $\eta = 8.9\%$ |
| Short-circuit current density: | $Jsc = 17.2$ mA/cm$^2$ |
| Open-circuit voltage: | $Voc = 0.78$ V |
| fill factor: | $FF = 0.66$ |

COMPARATIVE EXAMPLE 3

| | |
|---|---|
| Thickness of first layer: | 12000 Å |
| Thickness of second layer: | 10000 Å |

-continued

| | |
|---|---|
| Conversion efficiency: | η = 8.5% |
| Short-circuit current density: | Jsc = 16.2 mA/cm² |
| Open-circuit voltage: | Voc = 0.83 V |
| fill factor: | FF = 0.63 |

COMPARATIVE EXAMPLE 4

| | |
|---|---|
| Thickness of first layer: | 4000 Å |
| Thickness of second layer: | 500 Å |
| Conversion efficiency: | η = 8.0% |
| Short-circuit current density | Jsc = 16.6 mA/cm² |
| Open-circuit voltage: | Voc = 0.76 V |
| fill factor: | FF = 0.63 |

COMPARATIVE EXAMPLE 5

| | |
|---|---|
| Thickness of first layer: | 4000 Å |
| Thickness of second layer: | 4000 Å |
| Conversion efficiency: | η = 8.9% |
| Short-circuit current density: | Jsc = 16.8 mA/cm² |
| Open-circuit voltage: | Voc = 0.84 V |
| fill factor: | FF = 0.63 |

COMPARATIVE EXAMPLE 6

| | |
|---|---|
| Thickness of first layer: | 3000 Å |
| Thickness of second layer: | 1000 Å |
| Conversion efficiency: | η = 7.9% |
| Short-circuit current density: | Jsc = 15.3 mA/cm² |
| Open-circuit voltage: | Voc = 0.84 V |
| fill factor: | FF = 0.62 |

It will be noted that the solar cells according to the Comparative Examples 2–6 fail to attain the 9% order conversion efficiency of the Example 1–12. In the Comparative Example 6 which has a first layer thickness in the neighborhood of 3000 Å, it is presumed that the height of the crystal grains is too low to provide adequate scattering of light, while in the Comparative Examples 2 and 4 in which the thickness of the second layer is less than one-third that of the first layer, the sharp points of the first layer crystal grains are not adequately covered so that the major portion of the flat configuration of the overall transparent electrode is composed of an aggregate of sharp points.

On the other hand, in the Comparative Examples 3 and 5 in which the thickness of the second layer is more than two-thirds that of the first layer, the conversion efficiency η and other characteristics are at only fair levels, while the resistance of the transparent electrode is considerably high.

Still, in spite of the fact that their first layer thicknesses, second layer thicknesses and thickness ratios have been set at somewhat extreme values, these Comparative Examples 2–6 can, in comparison with the conventional solar cell having only a single-layer transparent electrode, be said to exhibit the effect of the present invention to some degree. This is clear from the fact that even these cells attain characteristic values that excel those announced for conventional cells.

However, in comparison with the earlier described Examples 1–12 wherein a conversion efficiency exceeding 9% can be easily attained, these Comparative Examples are not particularly interesting.

Taking an overall view of the foregoing then, it is found in the final analysis that where the starting materials and fabrication method exemplified by Example 1 are used, it is preferable to set the following conditions: (1) The average grain diameter of the first layer should be not less than 0.1 μm and the thickness of the second layer should be ⅓ to ⅔ the thickness of the first layer. (2) For attaining this relationship, the first layer should be formed to a thickness of 4000–12000 Å using a substrate temperature of 420°–480° C. during the formation thereof, and the second layer should be formed to a thickness within the aforesaid range using a substrate temperature of 350°–380° C. (3) The condition (1) above can if desired be specified by the results of X-ray diffraction. Namely, the first layer can be formed to have a peak for the (200) direction, with (101)/(200) being smaller than 0.5 before the formation of the second layer and being larger than 0.5 after the formation thereof.

Here it should be noted, however, that these are the preferred conditions in the case of an amorphous silicon solar cell having a tin oxide transparent electrode, such as a solar cell in accordance with one of the aforesaid Examples. The invention can, however, also be applied to, for example, various other amorphous type solar cells such as those of the amorphous silicon-germanium type and the amorphous silicon-carbide type, as well as to amorphous type solar cells containing minute amounts of crystalline material in the amorphous film and to crystal type solar cells such as CdTe, CuInSe₂ cells. In each of these types, the most preferable conditions can be determined by following a specific series of experimental steps.

Moreover, even as regards amorphous silicon semiconductor solar cells, there are cases like the following Example 13 wherein the formation temperatures of the first and second transparent electrode layers have little effect on the average grain diameter.

EXAMPLE 13

In this Example metal halide is used as the raw material for forming the first layer and an organometallic compound is used as the raw material for forming the second layer, thereby to obtain a two-layered structure made of different materials. The second layer was formed by the CVD method using a mixed gas comprising an inert carrier gas containing 4-ethyl tin+HF+-steam. In advance of actual fabrication of the solar cell, data was obtained by CVD formation of films on Corning #7059 glass substrates using substrate temperatures within the range of 350°–450° C.

Figure 8A:
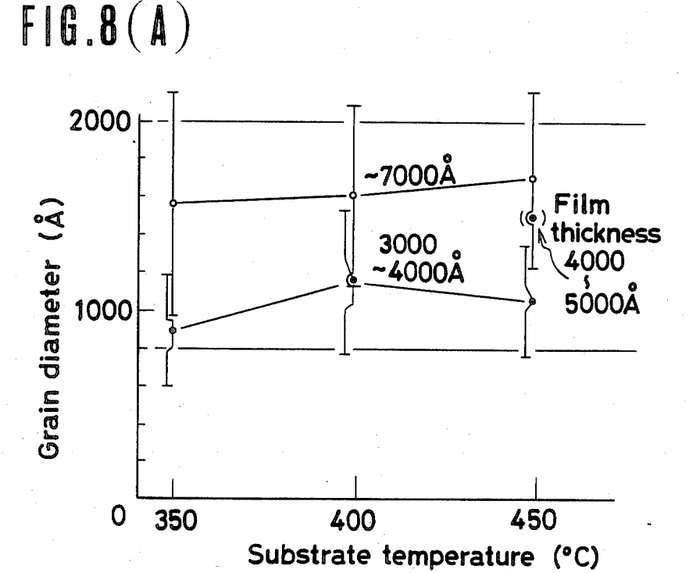
FIG. 8(A) is a graph showing an example in which the correlation between the substrate temperature and the average grain diameter of the crystal grains is relatively weak.

The result was, as shown by the average crystal grain diameter and standard deviation shown in FIG. 8(A), that the SnO₂ film formed in this way does not exhibit much correlation between the substrate temperature and the grain diameter Ra.

Figure 8B:
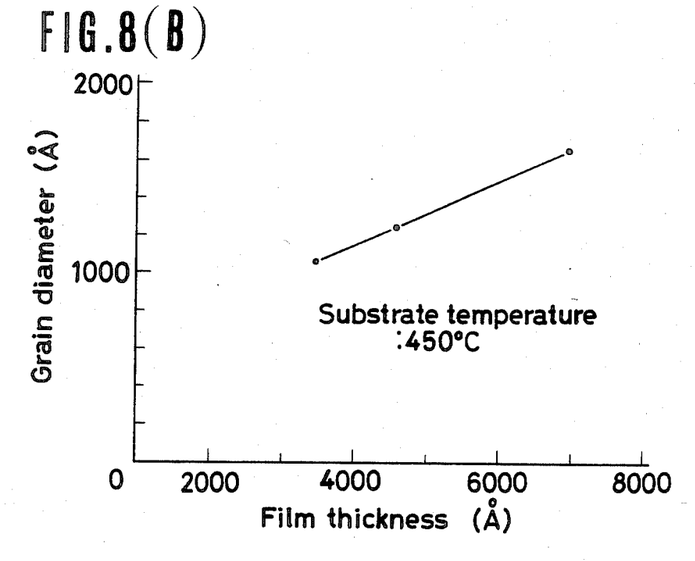
FIG. 8(B) is a graph showing an example in which there is strong correlation between the film thickness and the average grain diameter of the crystal grains.

On the other hand, however, a strong correlation is found between the thickness of the formed film and the average grain diameter. This is shown in FIG. 8(B).

Thus, SnO₂ film formation by use of 4-ethyl tin+HF+steam was applied only for the second layer of the transparent electrode and for the first layer there was used the CVD film produced using SnCl₄ etc. under the same conditions as those used for the aforesaid Example 7.

Figure 9:
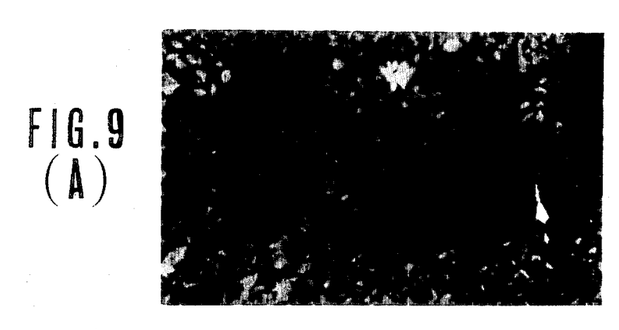

FIGS. 9(A) and 9(B) are scanning electron micrographs of tin oxide films formed as a single layer on a glass substrate. The film shown in FIG. 9(A) is an approximately 3000 Å thick SnO$_2$ film formed by the CVD method using 4-ethyl tin and a substrate temperature of 350° C. It is seen to be constituted of fine crystal grains of an adequately small average grain diameter. The film shown in FIG. 9(B) is an approximately 5000 Å thick SnO$_2$ film formed using SnCl$_4$ at a substrate temperature of 450° C. The crystal grains are adequately coarse and have sharply pointed tips.

When a tin oxide layer like that shown in FIG. 9(B) was formed as a first transparent electrode layer and a tin oxide layer like that shown in FIG. 9(A) was formed thereon as the second transparent electrode layer, the surface of the resulting transparent electrode presented an appearance as shown in FIG. 9(C).

As seen in FIG. 9(C), the feature which characterizes this transparent electrode is that the second layer appears to include crystal grains of a diameter larger than the average grain diameter of the first layer. In fact, however, this is not because large crystals have grown in the second layer but, as was touched on briefly earlier, because the fine crystals of the second layer envelop the tips of the crystal grains of the first layer not individually but in groups each consisting of a number of tips, thus giving the appearance of large crystals. Actually the surface is made up of small diameter crystals and the tips are adequately rounded.

This Example 13 exhibits the effects described earlier with respect to the other Examples. What deserves special attention regarding this Example, however, is that, as mentioned earlier, in some cases the average grain diameter of the crystal grains is not affected greatly by the film formation temperature. As a result, it becomes possible to more freely choose the other fabrication conditions.

As is clear from the foregoing description, in accordance with the present invention, even when the rough surface has a large average grain diameter, it is still possible to obtain an effect for the transparent electrode as a whole which is the same as that which would be obtained by rounding the tips of the crystal grains constituting the rough surface.

Needless to say, there is no need to numerically specify the relationship between the average grain diameters of the crystals of the first and second layers. Insofar as the average diameter of the crystals used in the second layer is smaller than the average grain diameter of the first layer, when each layer is separately deposited on the respective substrate, the effect of rounding the pointed tips of the first layer crystals will be substantially obtained to a greater or lesser degree. Moreover, control of the average grain diameter can be carried out with good operability by appropriately setting such conditions as the growth rate and the growth temperature (i.e. the substrate temperature) of the first and second layers, whereby it is only necessary to take into account design considerations relative to a specific grain size so as to assure a relationship which will provide the required characteristics.

As a guideline, however, it is noted that in a large number of cases a highly preferable relationship between the average grain diameters of the first and second layers is obtained when the thickness of the second layer is made about $\frac{1}{2}$ to $\frac{2}{3}$ that of the first layer. What this amounts to is making the thickness of the second layer approximately equal to the height of the surface grains of the first layer.

Figure 10:
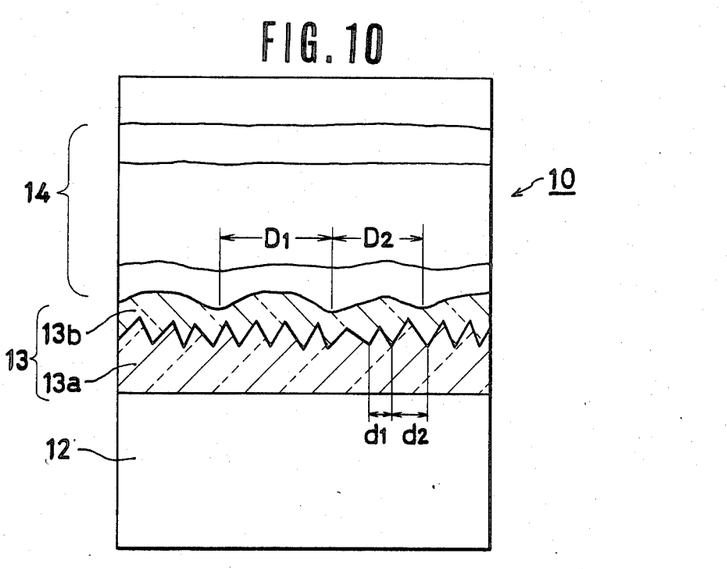
FIG. 10 is a schematic cross-sectional view of another embodiment of this invention.

It is further noted that even when the average grain diameter of the second layer is made smaller than that of the first layer, the appearance of the surface of the overall transparent electrode will be such that the grains of the second layer seem to be larger than that of the first layer, as shown in FIG. 10. That is, the grain diameters of the second layer, $D_1$ and $D_2$ are larger than those of the first layer, $d_1$ and $d_2$. This is only an illusion caused by the fact that in covering the coarse crystal grains of the first layer the fine crystal grains of the second layer envelop and round the tips of the coarse grains not individually but in groups. The fact remains however that the sharp tips of the first layer crystal grains are effectively rounded by the second layer crystal grains.

At any rate, the invention operates on a principle that is simple and well defined, making its range of application extremely wide.

For example, in view of the principle involved, there is no particular limitation on the nature of the material of the transparent electrode. It does not make any difference whether the material is tin oxide, the one most commonly applied in amorphous semiconductor solar cells, or one of the fairly commonly used materials such as indium oxide, indium tin oxide or zinc oxide, or even some other material or one of the foregoing materials in combination with another material. Moreover, the method for forming the laminated first and second layers on the substrate can also be freely chosen from among a wide variety of methods such as the spray method, the CVD method, the electron beam vacuum deposition method, the plasma CVD method, the sputtering method, the dipping method, the ion plating method, or a combination of such methods.

Nor is the invention subject to any limitation as regards the specific structure, physical properties, or fabrication processes of the photoelectric conversion section formed on the transparent electrode.

The present invention can be effectively applied to improve any kind of conventional thin-film solar cells, regardless of whether of the amorphous or crystalline type, insofar as it is of the kind that attempts to enhance the refracting effect with respect to the incident light by deliberately making the interface between a transparent electrode and a photoelectric conversion section rough through the provision of crystal grains of larger than a prescribed average grain diameter at said interface.

Moreover, even as regards, the case where the first layer of the transparent electrode is given a thickness approximately equal to that of the single layer in a conventional solar cell and the overall thickness of the transparent electrode consequently becomes thicker than that of a conventional solar cell after the provision of the second layer, it has been confirmed that this greater thickness has no substantial adverse effect on the electrical characteristics of the solar cell.

It is, moreover, possible in accordance with the present invention to constitute the second layer or a plurality of layers. Thus in a case where provision directly on the first layer having a large average grain diameter of a second layer having a fairly small average grain diameter leads to problems in connection with physical constant differences or the "fit" between the two layers, it is possible to constitute the second layer of a lower layer of crystal grains of medium coarseness and an upper layer of fine crystal grains.

As is clear from the foregoing, in accordance with the present invention it is possible to provide the transparent electrode with a rough surface so as to increase the effective length of the path of the light passing through the photoelectric conversion section without degrading the open-circuit voltage or the curve factor. In other words, the photoelectric conversion efficiency can be improved without causing any adverse effects.

What is more, the present invention attains this effect with an extremely simple structure that can be easily and precisely controlled.

The invention can thus be expected to make a major contribution to enhancing the characteristics and utilization of thin-film solar cells of this type

What is claimed is:

1. A thin-film solar cell, comprising:
   a transparent substrate;
   a transparent electrode formed on the transparent substrate which is constituted of a first layer in contact with the transparent substrate and a second layer formed on said first layer;
   a photoelectric conversion section formed on said second layer of said transparent electrode; and
   a light-reflective back electrode formed on the photoelectric conversion section,
   said first layer of the transparent electrode being formed of crystal grains having a relatively large average grain diameter such that said first layer presents a rough upper surface having a plurality of sharply tipped points and said second layer is formed of crystal grain having a relatively smaller average grain diameter on said first layer and is of sufficient thickness such that the upper surface of said first layer is rounded by the provision thereon of said second layer.

2. The thin-film solar cell of claim 1, wherein said first and second layers are form of $SnO_2$.

3. The thin-film solar cell of claim 2, wherein said photoelectric conversion section is constituted of a p-layer formed by the plasma CVD method using a mixed gas consisting of $SiH_4$ gas containing $B_2H_6$ gas and hydrocarbon gas, an i-layer formed by the plasma CVD method employing $SiH_4$ gas, and an n-layer formed by the plasma CVD method using a mixed gas consisting of $SiH_4$ gas containing $PH_3$ gas.

4. The thin-film solar cell of claim 3, wherein the back electrode is formed of aluminum.

5. The thin-film solar cell of claim 3, wherein the back electrode is formed of silver.

6. The thin-film solar cell of claim 3, wherein said back electrode is a 2-layered structure consistituted of a transparent electrode and a metallic electrode.

7. The thin-film solar cell of claim 3, wherein the first and second layers of the transparent electrode are each formed of tin oxide prepared from a tin halide material.

8. The thin-film solar cell of claim 3, wherein the tin oxide material of said first layer of said electrode is formed from a tin halide material and the tin oxide material of said second layer is formed from an organo-tin material.

9. The thin-film solar cell of claim 1, wherein the average grain diameter of the crystal gains of the first layer is not less than 0.1 $\mu$m and the film thickness of the second layer is $\frac{1}{3}$ to $\frac{2}{3}$ that of the first layer.

10. The thin film solar cell of claim 1, wherein the thickness of the first layer ranges from 4,000 to 12,000 Å.

11. The thin-film solar cell of claim 1, wherein the photoelectric conversion section is constituted in upward order from the transparent electrode of a p-layer exhibiting p-type coductivity, an i-layer constituted of a semiconductor having low impurity concentration, and an n-layer exhibiting n-type conductivity.

12. The thin-film solar cell of claim 11, wherein the p-layer, i-layer, and n-layer are all formed of amorphous semiconductor material.

13. The thin-film solar cell of claim 11, wherein the p-layer is formed by the plasma CVD method employing a mixed gas consisting of $SiH_4$ gas containing $B_2H_6$ gas and a hydrocarbon gas, the i-layer is formed by the plasma CVD method employing $SiH_4$ gas, and n-layer is formed by the plasma CVD method employing a mixed gas consisting of $SiH_4$ gas containing $PH_3$ gas.

14. The thin-film solar cell of claim 1, wherein the first layer of said transparent electrode is formed from a metal halide, and the second layer of the same is formed from an organo metallic compound.

15. A thin-film solar cell, comprising:
    a transparent substrate,
    a transparent electrode formed on the transparent substrate which is constituted of a first layer of $SnO_2$ in contact with the transparent substrate and a second layer of $SnO_2$ formed on said first layer;
    a photoelectric conversion section formed on the second layer of the transparent electrode; and
    a light-reflective back electrode formed on a photoelectric conversion section,
    said first layer of the transparent electrode being formed of crystal grains having a relatively large average grain diameter such that the said first layer presents a rough upper surface having a plurality of sharply tipped points and said second layer being formed of crystal grains having a relatively smaller average grain diameter on said first layer such that the upper surface of said first layer is rounded by the provision thereon of said second layer.

* * * * *